United States Patent
Park et al.

(10) Patent No.: US 7,902,011 B2
(45) Date of Patent: Mar. 8, 2011

(54) METHOD OF FABRICATING SCHOTTKY BARRIER TRANSISTOR

(75) Inventors: Sung-ho Park, Yongin-si (KR); Jin-seo Noh, Seoul (KR); Joong S. Jeon, Sengnam-si (KR); Eun-ju Bae, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/654,715

(22) Filed: Dec. 30, 2009

(65) Prior Publication Data

US 2010/0112771 A1 May 6, 2010

Related U.S. Application Data

(62) Division of application No. 12/149,894, filed on May 9, 2008, now Pat. No. 7,674,665.

(30) Foreign Application Priority Data

Dec. 24, 2007 (KR) .......................... 10-2007-0136399

(51) Int. Cl.
*H01L 21/338* (2006.01)
(52) U.S. Cl. ................. 438/167; 438/570; 257/E21.425; 257/E21.432
(58) Field of Classification Search .................. 438/167, 438/92, 169, 576; 257/E29.271, E21.425, 257/E21.432, E21.453, E29.041, E29.311, 257/E29.039, E31.065, E21.066, E27.068
See application file for complete search history.

(56) References Cited

U.S. PATENT DOCUMENTS

| | | | |
|---|---|---|---|
| 6,835,611 B1* | 12/2004 | Tsui et al. | 438/197 |
| 7,646,046 B2* | 1/2010 | Russ et al. | 257/288 |
| 2003/0096491 A1* | 5/2003 | Hizawa | 438/581 |
| 2004/0099966 A1 | 5/2004 | Chau et al. | |
| 2005/0136617 A1 | 6/2005 | Jang | |
| 2005/0139860 A1 | 6/2005 | Snyder et al. | |
| 2008/0081404 A1 | 4/2008 | Barna et al. | |

* cited by examiner

*Primary Examiner* — Khiem D Nguyen
*Assistant Examiner* — Shaka Scarlett
(74) *Attorney, Agent, or Firm* — Harness, Dickey & Pierce, P.L.C.

(57) ABSTRACT

Provided is a method of fabricating a Schottky barrier transistor. The method includes (a) forming a pair of cavities for forming a source forming portion and a drain forming portion having a predetermined depth and parallel to each other and a channel forming portion having a fin shape between the cavities in a substrate;

(b) filling the pair of cavities with a metal; (c) forming a channel, a source, and a drain by patterning the channel forming portion, the source forming portion, and the drain forming portion in a direction perpendicular to a lengthwise direction of the channel forming portion; (d) sequentially forming a gate oxide layer and a gate metal layer that cover the channel, the source, and the drain on the substrate; and (e) forming a gate electrode corresponding to the channel by patterning the gate metal layer, wherein one of the operations (b) through (e) further comprises forming a Schottky barrier by annealing the substrate.

7 Claims, 6 Drawing Sheets

METHOD OF FABRICATING SCHOTTKY BARRIER TRANSISTOR

PRIORITY STATEMENT

This application is a divisional application of U.S. application Ser. No. 12/149,894, filed May 9, 2008, now U.S. Pat. No. 7,674,665 the entire contents of which are incorporated herein by reference, which claims the benefit of Korean Patent Application No. 10-2007-0136399, filed on Dec. 24, 2007, in the Korean Intellectual Property Office, the entire contents of which are incorporated herein by reference.

BACKGROUND OF THE INVENTION

1. Field of the Invention

The present invention relates to a method of fabricating a transistor having a Schottky barrier, and more particularly, to a method of fabricating a transistor having a Schottky barrier that includes a three dimensional gate formed on a fin type channel.

2. Description of the Related Art

Studies have been conducted to scale down a metal oxide semiconductor field effect transistor (MOSFET) which is a unit device of a highly integrated logic circuit in order to increase performance and integration density. As the scale down of the MOSFET is progressed, a distance between source and drain is reduced, and thus, a short channel effect (SCE), that is, a phenomenon that a drain field modulates a gate field to be applied to a channel occurs resulting in the reduction of channel controllability of the gate. This phenomenon causes an electrical characteristic such as punch-through, drain-induced barrier lowering (DIBL), or threshold voltage roll-off.

The SCE severely occurs in a transistor having a very short gate length, for example, 50 nm or less, and as a result, a switching function which is the basic function of the transistor may be damaged. In order to address this problem, a channel doping method, an ultra-shallow junction method, or a gate dielectric thinning method may be used. However, these methods have a limit due to attendant problems such as a random doping problem and a gate leakage.

As a method of addressing the scale down problem, a transistor that has an increased contact surface between the channel and the gate by forming a three dimensional gate and has low power consumption by forming a Schottky barrier between a source and drain, and the channel.

Meanwhile, when a scale down transistor is fabricated, aligning errors between a channel and a source and a drain may occur during the formation of the source and drain are formed after forming the channel due to a plurality of mask processes.

SUMMARY OF THE INVENTION

To address the above and/or other problems, the present invention provides a method of fabricating a transistor having a Schottky barrier that may remove a scale down problem due to aligning error by using two masking processes in a direction perpendicular to each other.

The present invention also provides a method of fabricating a Schottky barrier transistor that may realize low power consumption and high speed by forming a gate using a metal, in which the Schottky barrier is formed at a low temperature by forming a source and a drain prior to forming the gate.

According to an aspect of the present invention, there is provided a method of fabricating a Schottky barrier transistor comprising: (a) forming a pair of cavities for forming a source forming portion and a drain forming portion having a predetermined depth and parallel to each other and a channel forming portion having a fin shape between the cavities in a substrate; (b) filling the pair of cavities with a metal; (c) forming a channel, a source, and a drain by patterning the channel forming portion, the source forming portion, and the drain forming portion in a direction perpendicular to a lengthwise direction of the channel forming portion; (d) sequentially forming a gate oxide layer and a gate metal layer that cover the channel, the source, and the drain on the substrate; and (e) forming a gate electrode corresponding to the channel by patterning the gate metal layer, wherein one of the operations (b) through (e) further comprises forming a Schottky barrier by annealing the substrate.

The annealing may be performed at a temperature of 450 to 600° C.

The channel may have at least a width of 45 nm or less.

The forming of the gate electrode comprises forming the gate metal layer covering three surfaces of the channel in the lengthwise direction of the channel forming portion.

The substrate may be one selected from the group consisting of a group III-V semiconductor substrate, a group II-VI semiconductor substrate, and an epitaxially grown SiGe substrate.

The source and the drain may be formed of a material selected from the group consisting of Ni, Pd, Pt, Ir, Rh, Co, W, Mo, Ta, Ti, and Er.

The gate oxide layer may be formed of one high-k material selected from the group consisting of $HfO_2$, $Al_2O_3$, $La_2O_3$, $ZrO_2$, HfSiO, HfSiON, HfLaO, LaAlO, and SrTiO.

The gate electrode may be formed of one material selected from the group consisting of TiAlN, MoN, TaCN, $W_2N$, TaSiN, TaN, and WC.

According to another aspect of the present invention, there is provided a method of fabricating a Schottky barrier transistor comprising: forming a metal layer on a silicon substrate; forming metal strips parallel to each other on both sides of a channel forming portion by patterning the metal layer; forming a source forming portion and a drain forming portion, which are metal silicide layers, on a lower side of the metal strip by annealing the silicon substrate; removing the metal strip; forming a channel, a source, and a drain by patterning the channel forming portion, the source forming portion, and the drain forming portion in a direction perpendicular to a lengthwise direction of the channel forming portion; sequentially forming a gate oxide layer and a gate metal layer that cover the channel, the source, and the drain on the silicon substrate; and forming a gate electrode corresponding to the channel layer by patterning the gate metal layer.

The source and the drain may be formed of a material selected from the group consisting of IrSi, PtSi, $Pt_2Si$, Pd2Si, RuSi, NiSi, $CoSi_2$, $WSi_2$, $CrSi_2$, $MoSi_2$, $VSi_2$, $ZrSi_2$, HfSi, $TaSi_2$, and $TiSi_2$.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
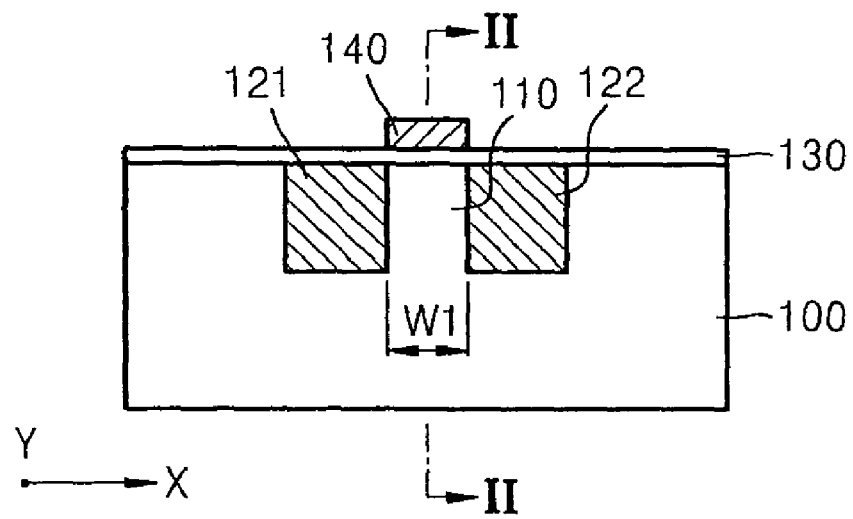
FIG. 1 is a schematic cross-sectional view of a structure of a Schottky barrier transistor fabricated according to an embodiment of the present invention.

The present invention will now be described more fully with reference to the accompanying drawings in which exemplary embodiments of the invention are shown. In the drawings, the thicknesses of layers and regions are exaggerated for clarity, and like reference numerals refer to the like elements.

Figure 2:
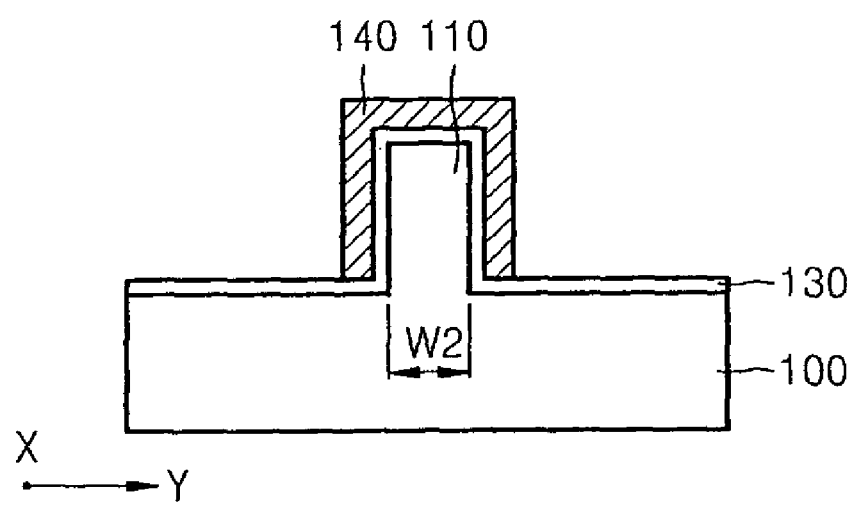
FIG. 2 is a cross-sectional view taken along line II-II of FIG. 1.

FIG. 1 is a schematic cross-sectional view of a structure of a Schottky barrier transistor fabricated according to an embodiment of the present invention. FIG. 2 is a cross-sectional view taken along line II-II of FIG. 1.

Referring to FIGS. 1 and 2, a fin type channel 110 is formed in a substrate 100, and a source 121 and a drain 122 are formed on both sides of the channel in an X direction. A gate oxide layer 130 and a gate electrode 140 are stacked on three surfaces of the fin type channel 110 in a Y direction. The gate oxide layer 130 may be further extended to cover the substrate 100.

The substrate 100 may be a silicon substrate, or may be a substrate formed of a group III-V semiconductor material such as GaAs, InGaAs, and InP or a group II-VI semiconductor material. Also, the substrate 100 may be a substrate having a SiGe layer epitaxially grown on a Si layer.

The fin type channel 110 may be formed to have narrow widths W1 and W2, for example, 45 nm or less. Since the fin type channel 110 may be formed by etching the substrate 100, the fin type channel 110 and the substrate 100 may be formed as a monolithic structure. The gate oxide layer 130 and the gate electrode 140 are formed to surround the three surfaces of the fin type channel 110, and thus, a contact area between the fin type channel 110 and the gate electrode 140 may increase.

The source 121 and the drain 122 are formed of a material that forms a Schottky barrier with the fin type channel 110. The source 121 and the drain 122 may be formed of a material having a high work function, such as Ni, Pd, Pt, Ir, Rh, etc., a material having a medium work function, such as Co, W, Mo, etc., and a material having a low work function, such as Ta, Ti, Er, etc. The metals having a high work function may be used in a p-MOS transistor and a low work function may be used in an n-MOS transistor. The metals having a medium work function may be selectively used in the n-MOS transistor or the p-MOS transistor. The source 121 and the drain 122 form a Schottky barrier with the fin type channel 110 at a relatively low temperature, for example, 450 to 600° C.

In the present embodiment, since the Schottky barrier is formed by annealing the fin type channel 110, the source 121 and the drain 122 after forming the fin type channel 110, the source 121, and the drain 122, the gate oxide layer 130 and the gate electrode 140 respectively may be formed of a high-k material and a metal. Also, even though the Schottky barrier is formed after the gate oxide layer 130 and the gate electrode 140 are formed, the annealing is performed at a low temperature, and thus, the gate oxide layer 130 and the gate electrode 140 respectively may be formed of a high-k material and a metal.

The gate oxide layer 130 may be formed of a high-k material such as $HfO_2$, $Al_2O_3$, $La_2O_3$, $ZrO_2$, HfSiO, HfSiON, HfLaO, LaAlO, SrTiO, etc. If such a high-k material is used to form the gate oxide layer 130, the gate oxide layer 130 may be formed to have a thickness greater than a conventional silicon oxide, and thus, a transistor having a reduced leakage current and low power consumption may be realized. If the gate oxide layer 130 is formed to have a thickness 20 Å or less using a silicon oxide, the gate oxide layer 130 may not function as a gate oxide film due to a high leakage current. However, even though the high-k material having a high dielectric constant is formed to have a thickness greater than that of the silicon oxide, electrical characteristics of the high-k material may be maintained as that of the silicon oxide. When the gate oxide layer 130 is formed of the high-k material and in order to realize the same electrical characteristics as the silicon oxide, the thickness of the high-k material may be increased relative to the dielectric constant of the silicon oxide. If the high-k material having a dielectric constant of ten times greater than that of the silicon oxide is used, theoretically the thickness of the high-k material may be increased to ten times greater than that of the silicon oxide.

The gate electrode 140 may be formed of TiAlN, MoN, or TaCN when a p-MOS transistor is fabricated and the gate electrode 140 may be formed of $W_2N$, TaSiN, TaN, or WC when an n-MOS transistor is fabricated. Such metal gate electrode 140 enables the application of high-k material that is hard to apply to a transistor of the prior art due to a reaction between a polysilicon and the high-k material, and may realize a high speed transistor by reducing a surface resistance characteristic much lower than that of the polysilicon and removing a gate depletion phenomenon. The metal gate electrode 140 may increase an amount of current to be applied to the fin type channel 110, and thus, may realize a high speed transistor.

In a transistor having a short channel according to the present embodiment, the sizes of the source 121 and the drain 122 are reduced as the lengths of the gate and the channel 110 are reduced. However, the resistance increase due to the size reduction of the source 121 and the drain 122 may be reduced by forming the source 121 and the drain 122 using a metal.

Also, a low power consumption and high speed transistor may be realized by forming a Schottky barrier between the channel 110, and the source 121 and the drain 122 and forming the gate using a metal.

FIGS. 3A through 3D are drawings for explaining a method of fabricating a Schottky barrier transistor according to an embodiment of the present invention.

Figure 3A:
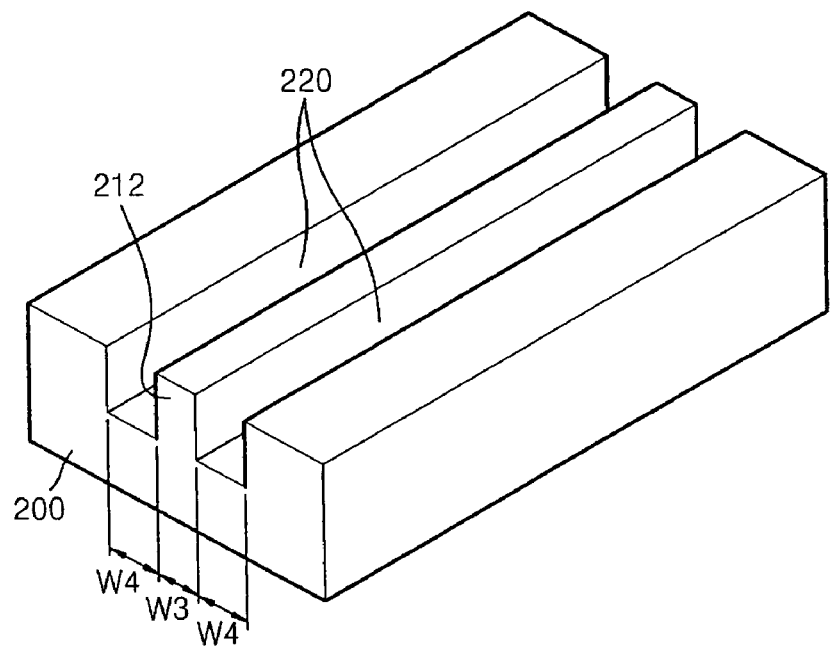
FIGS. 3A through 3D are drawings for explaining a method of fabricating a Schottky barrier transistor according to an embodiment of the present invention.

Referring to FIG. 3A, in order to form a channel forming portion 212 having a first width W3, cavities 220 respectively having a second width W4 are formed on both sides of the channel forming portion 212 in a substrate 200 using a mask (not shown). The substrate 200 may be a silicon substrate, and may be a substrate formed of a group III-V semiconductor which is a high mobility material such as GaAs, InGaAs, and InP or a group II-VI semiconductor. Also, the substrate 200 may be a substrate having a SiGe layer epitaxially grown on a Si layer. The channel forming portion 212 may have a fin shape. The first width W3 may be 45 nm or less.

Figure 3B:
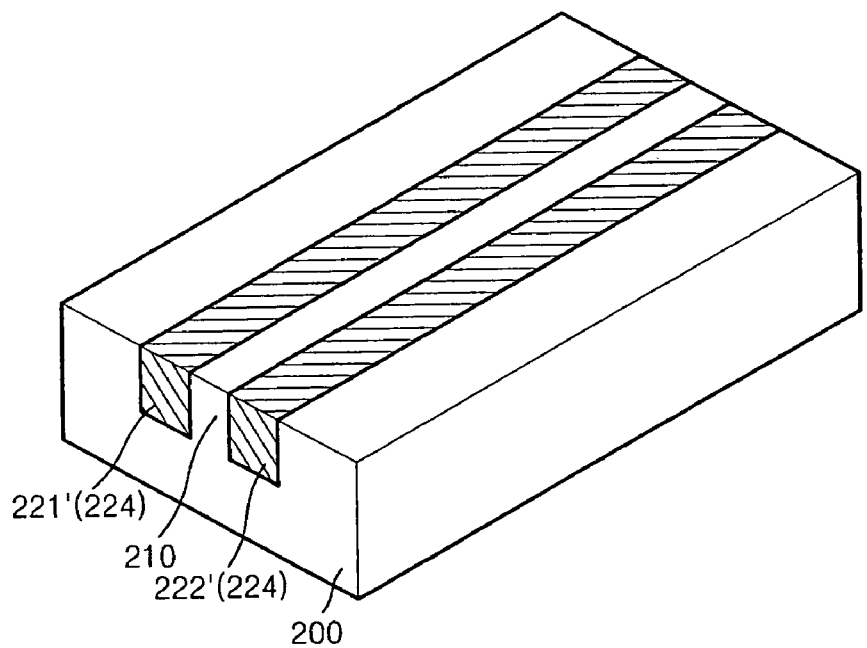

Referring to FIG. 3B, a metal material 224 is deposited on the substrate 200, and the metal material 224 is planarized using a chemical mechanical polishing (CMP) process. As a result, the cavities 220 are filled with the metal material 224 which are a source forming portion 221' and a drain forming portion 222'.

The metal material 224 may be a metal to form a Schottky barrier with the channel forming portion 212. The metal material 224 may be formed of a material having a high work function, such as Ni, Pd, Pt, Ir, or Rh, a material having a medium work function, such as Co, W, or Mo, and a material having a low work function, such as Ta, Ti, or Er. These metals having a high work function and a low work function respectively may be used in a p-MOS transistor and an n-MOS transistor. The metals may be selectively used according to the fabrication of the n-MOS transistor or the p-MOS transistor.

A Schottky barrier is formed between the metal material 224 and the channel forming portion 212 by annealing the substrate 200 at a relatively low temperature, for example, 450 to 600° C. for approximately 10 seconds. The annealing process may be performed in a subsequent process.

Figure 3C:
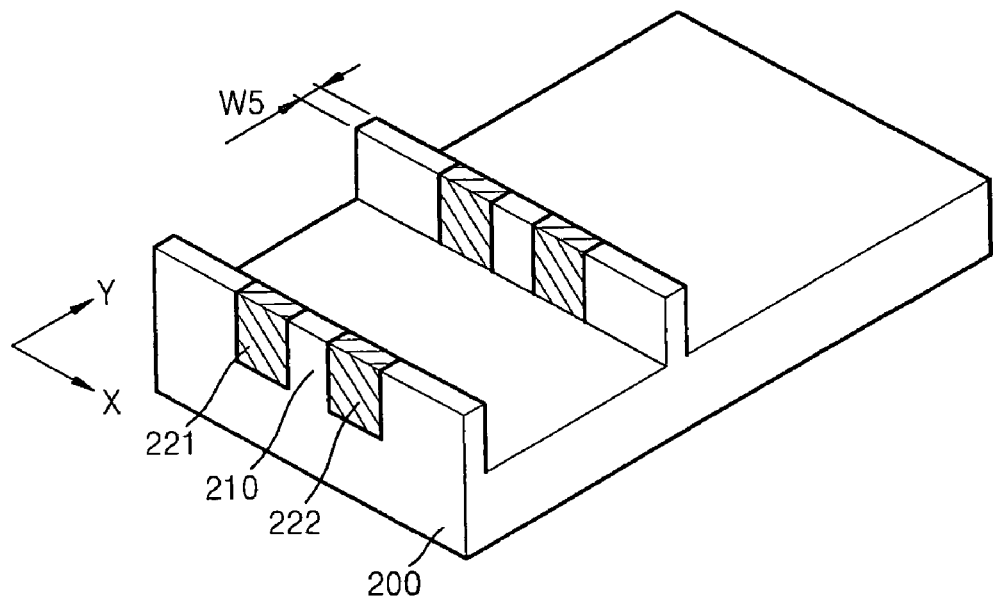

Referring to FIG. 3C, a channel 210, a source 221, and a drain 222 are formed by patterning the channel forming portion 212 and the source forming portion 221' and the drain forming portion 222' using a mask having a third width W5 in a lengthwise direction (the Y direction) of the channel forming portion 212. In the present embodiment, small sizes of the channel 210, the source 221, and the drain 222 may be formed without an aligning error since the channel 210, the source 221, and the drain 222 are formed through two steps of patterning which are performed in perpendicular directions from each other. The third width W5 may be 45 nm or less, and the first width W3 and the third width W5 may further shorter as the development of semiconductor patterning technique.

Figure 3D:
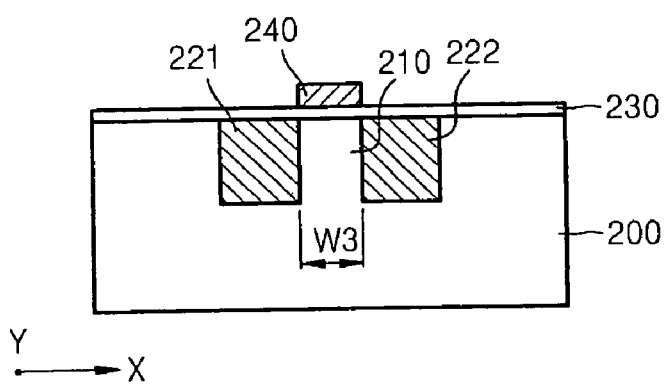

Referring to FIG. 3D, a gate oxide layer 230 covering the channel 210, the source 221, and the drain 222 is deposited on the substrate 200, and a gate metal layer (not shown) is deposited on the gate oxide layer 230. A gate electrode 240 is formed by patterning the gate metal layer. The gate oxide layer 230 and the gate electrode 240 are formed to cover three exposed surfaces of the channel 210.

The gate oxide layer 230 may be formed of a high-k material such as $HfO_2$, $Al_2O_3$, $La_2O_3$, $ZrO_2$, HfSiO, HfSiON, HfLaO, LaAlO, and SrTiO.

The gate metal layer may be formed of TiAlN, MoN, or TaCN when a p-MOS transistor is fabricated, and may be formed of $W_2N$, TaSiN, TaN, or WC when an n-MOS transistor is fabricated.

Electrode pads (not shown) connected to the source 221, the drain 222, and the gate electrode 240 may be formed using conventional semiconductor processes, and thus, the detailed description thereof will be omitted.

In the method of fabricating a Schottky barrier transistor according to an embodiment of the present invention, an aligning error is not occurred since the channel, the source, and the drain are formed using a second mask in a direction perpendicular to the first mask after forming the channel forming portion, the source forming portion, and the drain forming portion using the first mask. Also, since the source and the drain are formed prior to forming the gate, the annealing for forming the Schottky barrier may be performed ahead of forming the gate. Thus, the gate may be formed of a metal that is weak to high temperature, and may realize a transistor having a short channel.

Figure 4:
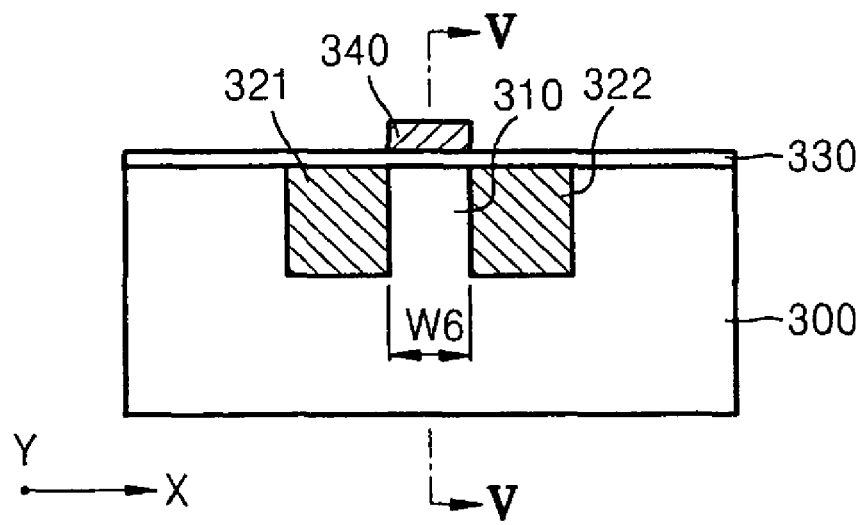
FIG. 4 is a cross-sectional view of a structure of a Schottky barrier transistor fabricated according to another embodiment of the present invention.
Figure 5:
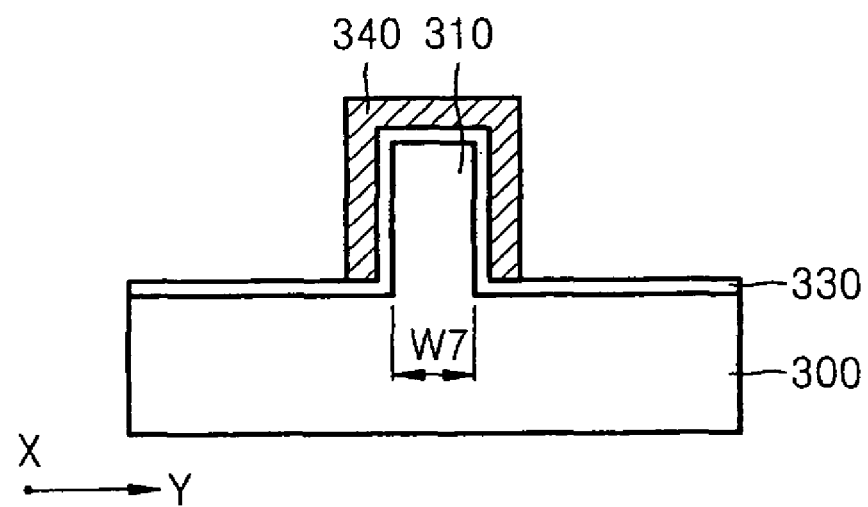
FIG. 5 is a cross-sectional view taken along line V-V of FIG. 4.

FIG. 4 is a cross-sectional view of a structure of a Schottky barrier transistor fabricated according to another embodiment of the present invention, and FIG. 5 is a cross-sectional view taken along line V-V of FIG. 4.

Referring to FIGS. 4 and 5, a fin type channel 310 is formed in a substrate 300, and in an X direction, a source 321 and a drain 322 are formed on either side of the channel 310. In a Y direction, a gate oxide layer 330 and a gate electrode 340 are stacked on three surfaces of the channel 310.

The substrate 300 may be a silicon substrate.

The channel 310 has narrow widths W6 and W7, for example, 45 nm or less. The channel 310 may be formed by patterning the substrate 300, and thus, the channel 310 is formed in one-body with the substrate 300. A gate oxide layer 330 and a gate electrode 340 are formed to surround three surfaces of the channel 310, and thus, the contact area between the channel 310 and the gate electrode 340 may be increased.

The source 321 and the drain 322 are metal silicides formed by metal diffusion of a metal strip (not shown) due to annealing the substrate 300 after forming the metal strip on the substrate 300, and, in the process of annealing, the source 321 and the drain 322 form a Schottky barrier together with the channel 310. The source 321 and the drain 322 may be formed of a material having a high work function such as IrSi, PtSi, $Pt_2Si$, and Pd2Si, material having a medium work function such as RuSi, NiSi, $CoSi_2$, $WSi_2$, $CrSi_2$, and, $MoSi_2$, and a material having a low work function such as $VSi_2$, $ZrSi_2$, HfSi, $TaSi_2$, and $TiSi_2$. The metal silicides having a high work function are used to form a p-MOS transistor and the metal silicides having a low work function are used to form an n-MOS transistor. The metal silicides having a medium work function may be selectively used to form the n-MOS transistor or the p-MOS transistor.

Since the annealing for forming the metal silicides and the Schottky barrier may be performed prior to forming the gate oxide 330 and the gate electrode 340, the gate oxide layer 330 and the gate electrode 340 may be formed of a high-k material and a metal that are weak to heat. Also, although the annealing for forming the metal silicides and the Schottky barrier is performed after forming the gate oxide 330 and the gate electrode 340, the annealing is performed at a low temperature, thus, the gate oxide layer 330 and the gate electrode 340 may be formed of a high-k material and a metal, respectively.

The gate oxide layer 330 may be formed of a high-k material such as $HfO_2$, $Al_2O_3$, $La_2O_3$, $ZrO_2$, HfSiO, HfSiON, HfLaO, LaAlO, and SrTiO.

The gate electrode 340 may be formed of TiAlN, MoN, or TaCN when a p-MOS transistor is formed, and may be formed of $W_2N$, TaSiN, TaN, or WC when an n-MOS transistor is formed.

In the transistor according to the present embodiment, the sizes of the source 321 and the drain 322 are reduced as the lengths of the gate and the channel 310 are reduced. However, the resistance increase due to the size reduction of the source 321 and the drain 322 may be reduced by forming the source 321 and the drain 322 using a metal silicide.

Also, a transistor using low power consumption and working at a high speed may be realized since a Schottky barrier is formed in the transistor and the gate is formed of a metal.

FIGS. 6A through 6D are drawings for explaining a method of fabricating a Schottky barrier transistor according to another embodiment of the present invention.

Figure 6A:
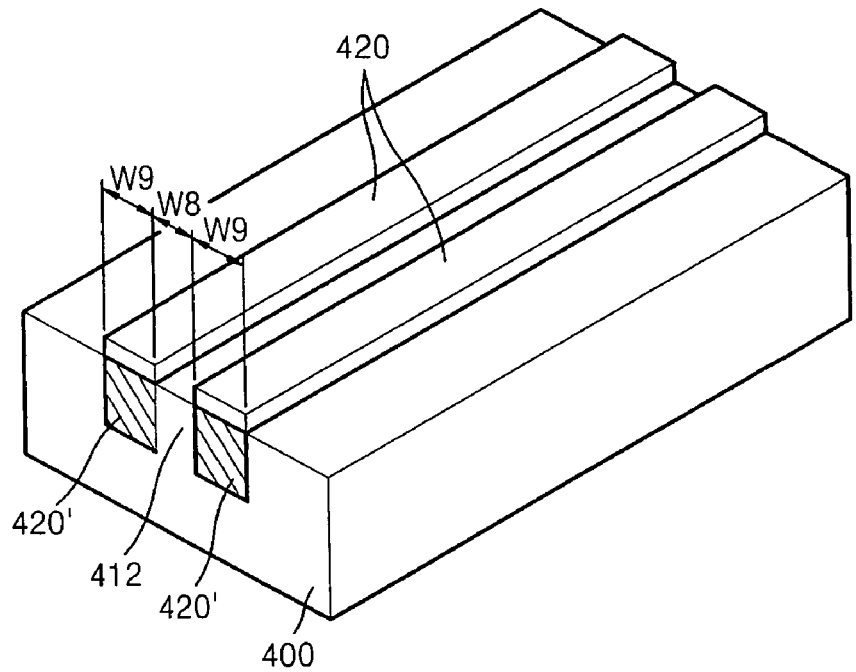
FIGS. 6A through 6D are drawings for explaining a method of fabricating a Schottky barrier transistor according to another embodiment of the present invention.

Referring to FIG. 6A, after depositing a metal layer (not shown) on a silicon substrate 400, metal strips 420 respectively having a second width W9 are formed on either side of a channel forming region having a first width W8 by patterning the metal layer. The metal strips 420 may be formed of Ir, Pd, Pt, Ru, Ni, Co, W, Cr, Mo, V, Zr, Hf, Ta, or Ti. The metal strips 420 are formed parallel to each other.

The silicon substrate 400 is annealed at a temperature of, for example, 450 to 600° C. for 10 seconds to diffuse a metal in the metal strips 420 into the silicon substrate 400, and thus, metal silicides 420' are formed on a surface of the silicon substrate 400.

Figure 6B:
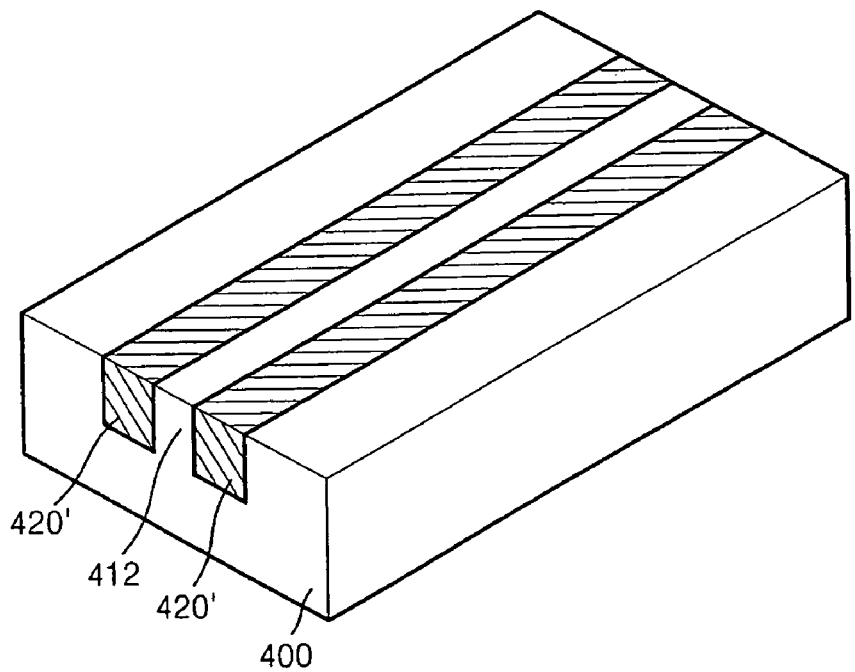

Referring to FIG. 6B, the metal strips 420 are removed by acid treatment. Thus, the metal silicides 420' are formed in the silicon substrate 400, and a channel forming portion 412 having a fin shape is formed between the metal silicides 420'. The metal silicides 420' form a Schottky barrier between the metal silicides 420' and the channel forming portion 412. The metal silicides 420' are a source forming portion and a drain forming portion.

The metal silicides 420' may be formed of a material having high work function such as IrSi, PtSi, $Pt_2Si$, and $Pd_2Si$, a material having medium work function such as RuSi, NiSi, $CoSi_2$, $WSi_2$, $CrSi_2$, and $MoSi_2$, and a material having low work function such as $VSi_2$, $ZrSi_2$, HfSi, $TaSi_2$, and $TiSi_2$ according to a metal of the metal strips 420. The metal silicides 420' having a high work function are used to form a p-MOS transistor, the metal silicides 420' having a low work function are used to form an n-MOS transistor, and the metal silicides 420' having a medium work function may be selectively used to form the p-MOS transistor or an n-MOS transistor.

Figure 6C:
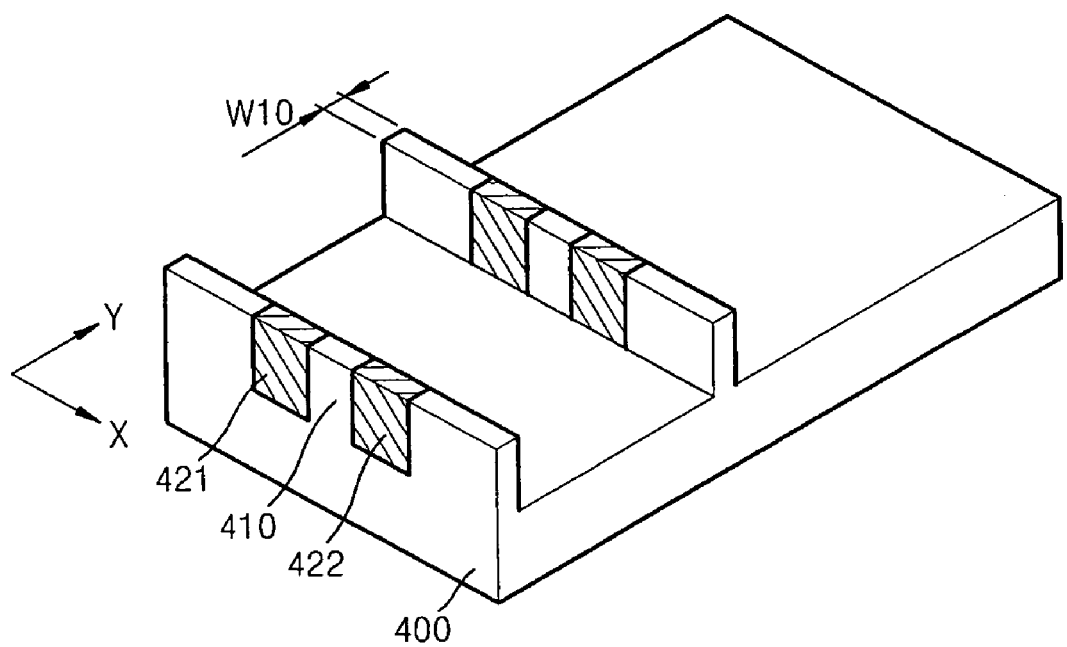

Referring to FIG. 6C, a channel 410, a source 421, and a drain 422 are formed by etching the channel forming portion 412 and the metal silicides 420' using a mask (not shown) having a width W10 in a lengthwise direction (a Y direction) of the channel forming portion 412. In the present embodiment, since the channel forming portion 412 and the metal silicides 420' are etched in a direction perpendicular to the lengthwise direction (the Y direction) of the channel forming portion 412, the channel 410, the source 421, and the drain 422 may be precisely formed. For example, the channel 410 having small widths W8 and W10, for example, 45 nm or less may be formed.

Figure 6D:
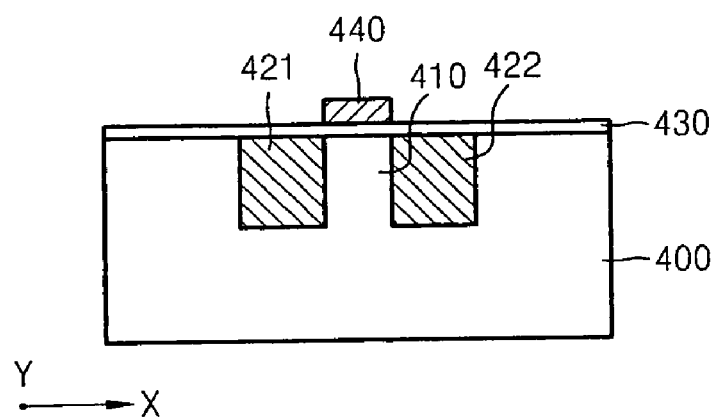

Referring to FIG. 6D, a gate oxide layer 430 covering the channel 410, the source 421, and the drain 422 is deposited on the silicon substrate 400, and a gate metal layer (not shown) is deposited on the gate oxide layer 430. A gate electrode 440 is formed by patterning the gate metal layer. The gate oxide layer 430 and the gate electrode 440 are formed to cover three exposed surfaces of the channel 410.

The gate oxide layer 430 may be formed of a high-k material such as $HfO_2$, $Al_2O_3$, $La_2O_3$, $ZrO_2$, HfSiO, HfSiON, HfLaO, LaAlO, and SrTiO.

The gate electrode 440 may be formed of TiAlN, MoN, or TaCN when a p-MOS transistor is fabricated, and may be formed of $W_2N$, TaSiN, TaN, or WC when an n-MOS transistor is fabricated.

Electrode pads (not shown) connected to the source 421, the drain 422, and the gate electrode 440 may be formed using conventional semiconductor processes, and thus, the detailed description thereof will be omitted.

In the method of fabricating a Schottky barrier transistor according to another embodiment of the present invention, an aligning error is not occurred since the channel 410, the source 421, and the drain 422 are formed using a second mask in a direction perpendicular to the first mask after forming the channel forming portion, the source forming portion, and the drain forming portion using the first mask. Also, since the source 421 and the drain 422 are formed prior to forming the gate, the annealing for forming the Schottky barrier may be performed ahead of forming the gate. Thus, the gate may be formed of a material that is weak to high temperature, and may realize a transistor having a short channel in which the controllability of the gate is improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a Schottky barrier transistor comprising:
    forming a metal layer on a silicon substrate;
    forming metal strips parallel to each other on both sides of a channel forming portion by patterning the metal layer;
    forming a source forming portion and a drain forming portion, which are metal silicide layers, on a lower side of the metal strip by annealing the silicon substrate;
    removing the metal strip;
    forming a channel, a source, and a drain by patterning the channel forming portion, the source forming portion, and the drain forming portion in a direction extending from the source to the drain;
    sequentially forming a gate oxide layer and a gate metal layer that cover the channel, the source, and the drain on the silicon substrate; and
    forming a gate electrode corresponding to the channel layer by patterning the gate metal layer.

2. The method of claim 1, wherein the annealing is performed at a temperature of 450 to 600° C.

3. The method of claim 1, wherein the channel has at least a width of 45 nm or less.

4. The method of claim 3, wherein the forming of the gate electrode comprises forming the gate metal layer covering three surfaces of the channel in the lengthwise direction of the channel forming portion.

5. The method of claim 1, wherein the source and the drain are formed of a material selected from the group consisting of iridium silicide (IrSi), platinum silicide (PtSi, $Pt_2Si$), palladium silicide ($Pd_2Si$), ruthenium (RuSi), nickel silicide (NiSi), cobalt silicide ($CoSi_2$), tungsten silicide ($WSi_2$), chromium silicide ($CrSi_2$), molybdenum silicide ($MoSi_2$), vanadium silicide ($VSi_2$), zirconium silicide ($ZrSi_2$), hafnium silicide (HfSi), tantalum silicide ($TaSi_2$), and titanium silicide ($TiSi_2$).

6. The method of claim 1, wherein the gate oxide layer is formed of one high-k material selected from the group consisting of hafnium oxide ($HfO_2$), aluminum oxide ($Al_2O_3$), lanthanum oxide ($La_2O_3$), zirconium oxide ($ZrO_2$), hafnium silicate (HfSiO), hafnium silicon oxynitride (HfSiON), hafnium lanthanum oxide (HfLaO), lanthanum aluminum oxide (LaAlO), and strontium titanium oxide (SrTiO).

7. The method of claim 1, wherein the gate electrode is formed of one material selected from the group consisting of titanium aluminum nitride (TiAlN). molybdenum nitride (MoN), tantalum carbonitride (TaCN), tungsten nitride ($W_2N$), tantalum silicon nitride (TaSiN), tantalum nitride (TaN), and tungsten carbide (WC).

* * * * *